United States Patent
Hsieh

(10) Patent No.: US 9,676,609 B2
(45) Date of Patent: Jun. 13, 2017

(54) INTEGRATED MEMS DEVICE

(71) Applicant: Asia Pacific Microsystems, Inc., Hsinchu (TW)

(72) Inventor: Jerwei Hsieh, Hsinchu (TW)

(73) Assignee: Asia Pacific Microsystems, Inc., Hsinchu (TW)

( * ) Notice: Subject to any disclaimer, the term of this patent is extended or adjusted under 35 U.S.C. 154(b) by 0 days.

(21) Appl. No.: 15/144,896

(22) Filed: May 3, 2016

(65) Prior Publication Data

US 2016/0244323 A1    Aug. 25, 2016

Related U.S. Application Data

(62) Division of application No. 14/165,752, filed on Jan. 28, 2014, now Pat. No. 9,359,193.

(30) Foreign Application Priority Data

Jan. 28, 2013   (TW) .............................. 102201843 U
Jul. 30, 2013   (TW) .............................. 102127210 A

(51) Int. Cl.
   *H01L 21/4763*    (2006.01)
   *B81B 7/00*    (2006.01)
   *B81C 1/00*    (2006.01)

(52) U.S. Cl.
   CPC .......... *B81B 7/0038* (2013.01); *B81B 7/0058* (2013.01); *B81C 1/00238* (2013.01); *B81C 1/00817* (2013.01); *B81C 1/00825* (2013.01); *B81B 2201/032* (2013.01); *B81C 2201/053* (2013.01); *B81C 2201/056* (2013.01); *B81C 2203/0785* (2013.01)

(58) Field of Classification Search
   CPC ............. H01L 21/4763; H01L 21/7806; H01L 21/76801; H01L 21/76802; H01L 23/5329
   See application file for complete search history.

(56) References Cited

U.S. PATENT DOCUMENTS

| | | |
|---|---|---|
| 5,083,857 A | 1/1992 | Hornbeck |
| 6,525,864 B1 | 2/2003 | Gee et al. |
| 6,635,506 B2 | 10/2003 | Volant et al. |
| 7,015,885 B2 | 3/2006 | Novotny et al. |
| 7,291,513 B2 | 11/2007 | Ouellet et al. |
| 7,442,570 B2 | 10/2008 | Nasiri et al. |
| 8,143,082 B2 | 3/2012 | Dungan et al. |
| 8,217,474 B2 | 7/2012 | Lee et al. |
| 8,269,291 B2 | 9/2012 | Buchwalter et al. |
| 2003/0107794 A1 | 6/2003 | Siekkinen et al. |

(Continued)

*Primary Examiner* — Phuc Dang
(74) *Attorney, Agent, or Firm* — Alan D. Kamrath; Kamrath IP Lawfirm, P.A.

(57) ABSTRACT

An integrated MEMS device is provided. The integrated MEMS device comprises a circuit chip and a device chip. The circuit chip has a patterned first bonding layer disposed thereon, the bonding layer being composed of a conductive material/materials. The device chip has a first structural layer and a second structural layer, the first structural layer being connected to the second structural layer and the first bonding layer of the circuit chip, and being sandwiched between the second structural layer and the circuit chip. A plurality of hermetic spaces are enclosed by the first structural layer, the second structural layer, the first bonding layer and the circuit chip.

20 Claims, 21 Drawing Sheets

(56) References Cited

U.S. PATENT DOCUMENTS

| | | | |
|---|---|---|---|
| 2005/0274193 A1* | 12/2005 | Kwon | G01L 9/065 73/727 |
| 2007/0066027 A1* | 3/2007 | Lin | H04R 31/00 438/424 |
| 2011/0018117 A1 | 1/2011 | Yang et al. | |
| 2011/0027941 A1 | 2/2011 | Kumar et al. | |
| 2011/0062532 A1* | 3/2011 | Wang | B81C 1/00333 257/415 |
| 2011/0104844 A1* | 5/2011 | Hsieh | B81C 1/00246 438/50 |
| 2012/0112347 A1* | 5/2012 | Eckhardt | H01L 21/6835 257/751 |
| 2014/0159066 A1 | 6/2014 | Hu et al. | |
| 2014/0206123 A1* | 7/2014 | Chu | B81C 1/00039 438/51 |
| 2015/0102437 A1* | 4/2015 | Liu | B81B 3/0021 257/419 |

* cited by examiner

INTEGRATED MEMS DEVICE

FIELD OF THE INVENTION

The present invention relates to an integrated MEMS device, especially an integrated MEMS device whose manufacturing method a MEMS wafer and a circuit wafer are bonded together first and then a sacrificial layer is removed.

BACKGROUND OF THE INVENTION

Techniques for integrating MEMS devices and circuit chips are important especially for the application of MEMS array-type devices. Through these techniques it is possible to integrate MEMS units of the MEMS array-type devices such as capacitive micromachined ultrasonic transducer (CMUT) and reflective micromirror array and circuit chips, thereby achieving the most effective electrical connections and control. For example, the optical array-type devices commonly adopted for many fields comprise a plurality of reflective micromirrors. These reflective micromirrors may rotate about a fixed axis to guide light toward an emitting direction. Please refer to FIG. 1. FIG. 1 illustrates a structure of the optical array-type device disclosed by U.S. Pat. No. 5,083,857. This optical array-type device 10 comprises a reflective mirror 11 and a flexible structure 15. The reflective mirror 11 is firmly connected to the flexible structure 15 via a anchor structure 12. Furthermore, the optical array-type device 10 also comprises an electrode 14. The electrode and the flexible structure 15 jointly form an actuator unit. It is possible to control the deformation of the flexible structure 15 hence the inclination angle of the reflective mirror 11 (see dashed lines 11a and 11b in FIG. 1) through inputting a control signal to the electrode 14. By adjusting the inclination angle of the reflective mirror 11, it is possible to adjust the light emitting direction in order to generate the expected optical effect. Since more planar the surface of the reflective mirror 11 is the bigger the effective area lit by the incident light is, the flexible structure 15 is designed to be hidden under the reflective mirror 11. This would better the device performance, but also make the manufacturing process more challenging. Moreover, it is noted from FIG. 1 that a recess 13 is formed right in the center of the reflective mirror 11. The recess 13 rises from a process of manufacturing the anchor structure 12 and it would prevent the light passing therethrough from being reflected effectively, thereby reducing device performance. In the process for manufacturing the optical array-type device 10, the reflective mirror 11 is formed by performing micromachining processes on a circuit wafer (please refer to FIGS. 7a-7b in U.S. Pat. No. 5,083,857 for detailed manufacturing processes). In order to avoid adversely affecting the circuitry on/in the circuit wafer, process temperatures and materials used to manufacture the optical array-type device should be limited to low temperature formed materials such as metals. However, this limitation would degrade structural reliability, surface roughness and surface topography hence total quality of the finished optical array-type device 10.

SUMMARY OF THE INVENTION

To solve the above problems, an integrated MEMS device is provided.

In light of the above and other objectives, the present invention provides an integrated MEMS device. The integrated MEMS device comprises a circuit chip and a device chip. A patterned first bonding layer composed of a bondable conductive material/materials is disposed on the circuit chip. The device chip comprises a first structural layer and a second structural layer, wherein the first structural layer is connected to the second structural layer and between the second structural layer and the circuit chip. There are many hermetic spaces formed between the second structural layer and the circuit chip, wherein the hermetic spaces are enclosed by the first structural layer, the second structural layer and the circuit chip. These hermetic spaces are in vacuum state. Furthermore, the integrated MEMS device may further comprise a second bonding layer between the first structural layer and the first bonding layer, wherein the second bonding layer is composed of a bondable conductive material/materials. Alternatively, there may be a second sacrificial layer between the second bonding layer and the first structural layer, wherein the second sacrificial layer is composed of a conductive material/materials.

DETAILED DESCRIPTION OF PREFERRED EMBODIMENTS

Figure 2A:
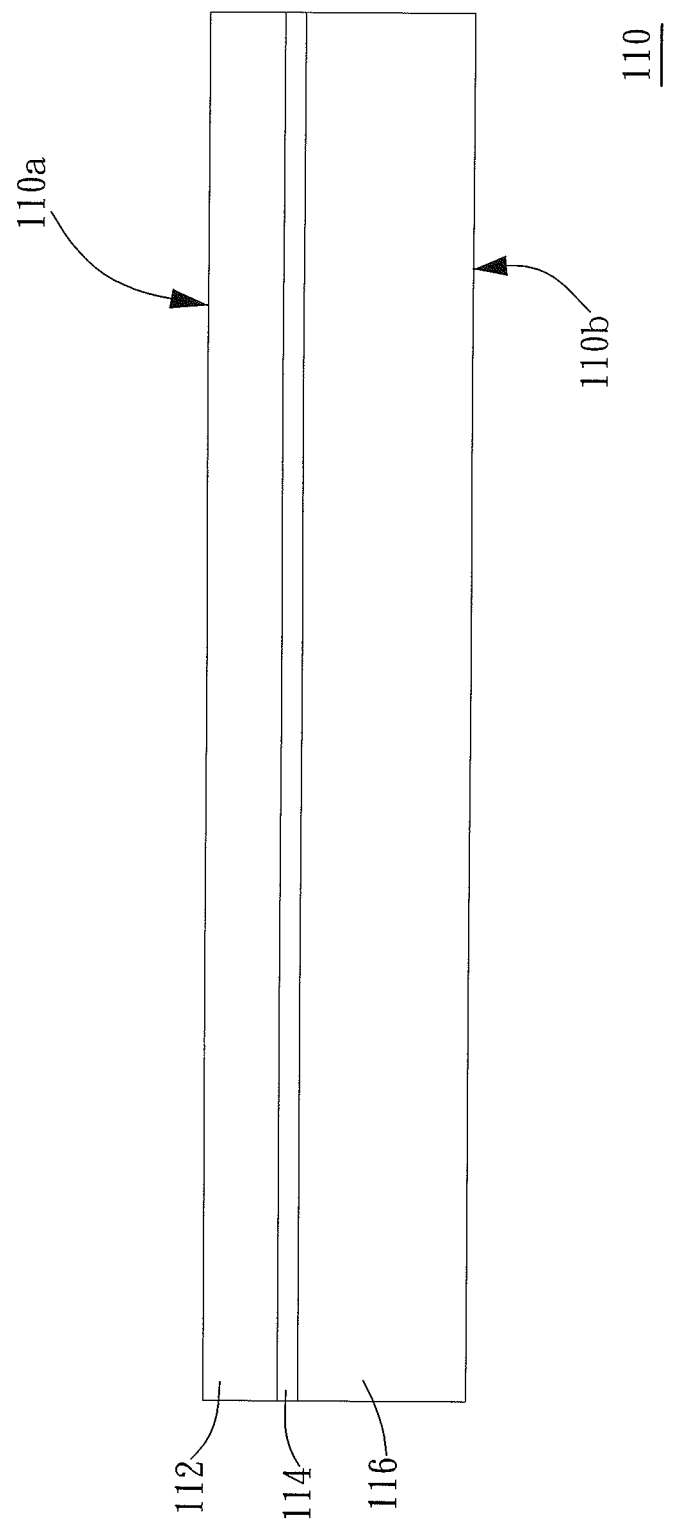
FIGS. 2A-2J illustrate a method for manufacturing the integrated MEMS device according to one embodiment of the present invention.

Please refer to FIGS. 2A-2J which show an embodiment of a method for manufacturing the integrated MEMS device according to one embodiment of the present invention. First, provide a device wafer 110 as shown in FIG. 2A. The device wafer 110 comprises a first surface 110a and a second surface 110b. The second surface 110b is on the opposite side of the device wafer 110 with respect to the first surface 110a. In this embodiment, the device wafer 110 is a silicon-on-insulator (SOI) structure. The device wafer 110 comprises a silicon device layer 112, an insulating layer 114 and a silicon substrate 116, wherein the first surface 110a is on the silicon device layer 112 and the second surface 110b is on the silicon substrate 116.

Figure 2B:
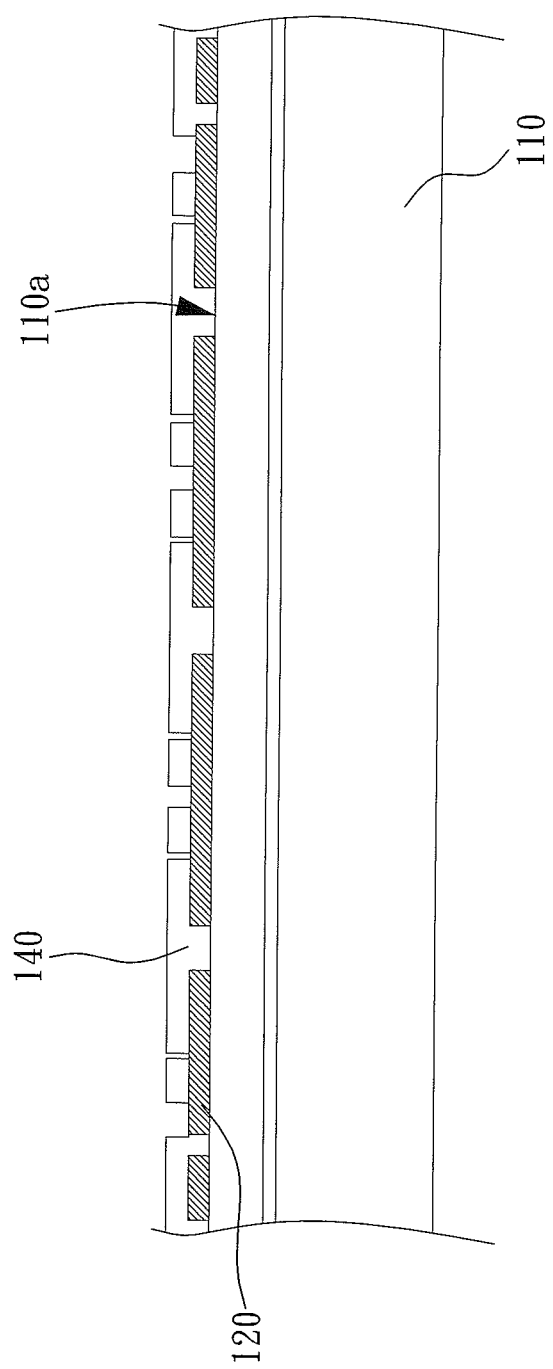

Next, as shown in FIG. 2B, a first sacrificial layer 120 and a first structural layer 140 are sequentially formed on the first surface 110a on the device wafer 110, wherein the first structural layer 140 partially covers the first sacrificial layer 120. In this embodiment, the first structural layer 140 is mainly composed of polysilicon, monocrystalline silicon, or amorphous silicon and the first sacrificial layer 120 is mainly composed of silicon oxide, wherein the first sacrificial layer 120 and the first structural layer 140 are patterned by photolithography and etching processes.

Figure 2C:
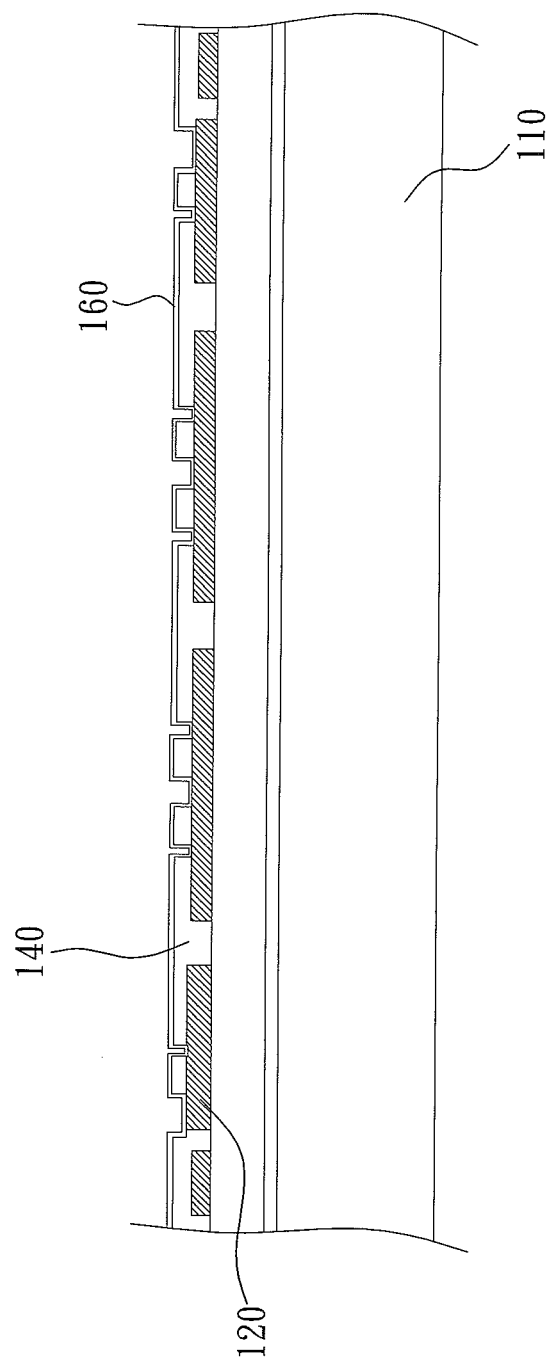

Next, a second sacrificial layer 160 is formed to cover the whole device wafer 110 including the first structural layer 140 and a portion of the first sacrificial layer 120 as shown in FIG. 2C. It is clear from the FIG. 2C that a portion of the second sacrificial layer 160 is in contact with the first sacrificial layer 120 because the first structural layer 140 is patterned before the formation of the second sacrificial layer 160. In this embodiment, the second sacrificial layer is made from a conductive material/materials such as copper or chromium. In this embodiment, the material/materials of the second sacrificial layer 160 needs/need to meet the following requirements:

1) good adhesion ability;
2) good etching selectivity with respect to a bonding material/materials of the bonding layer such as silicon oxide, aluminum, gold, tin, germanium;
3) capable of withstanding the process temperature during bonding of the device wafer 110 and the circuit wafer 210;
4) would not crack due to high stress during etching of the first sacrificial layer 120.

Figure 2D:
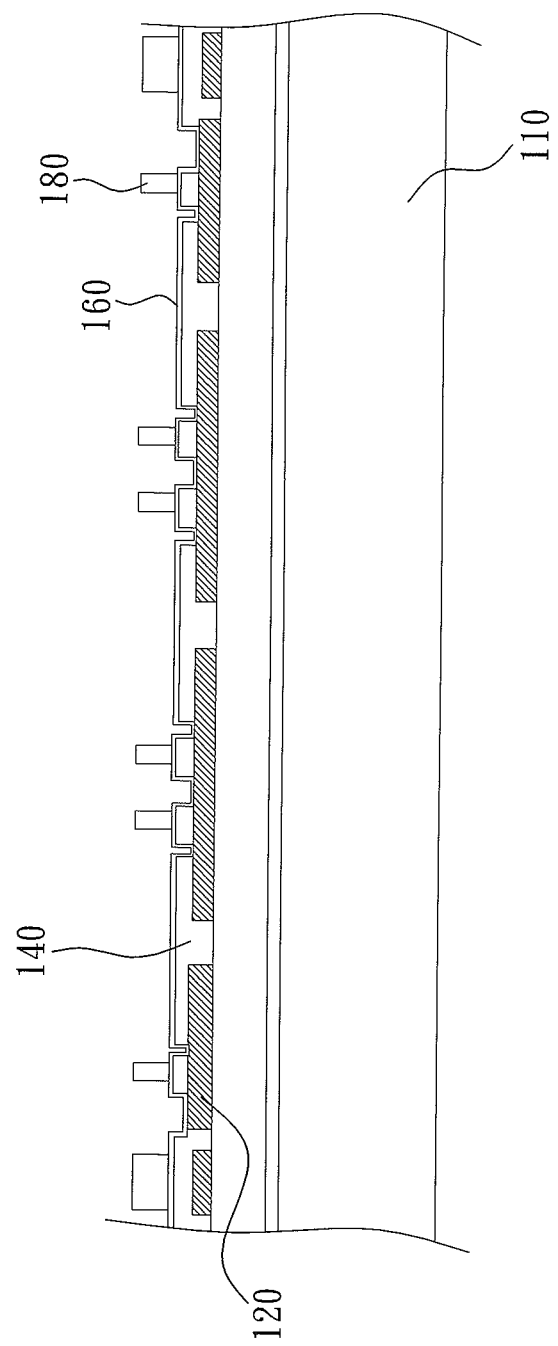
Figure 8A:
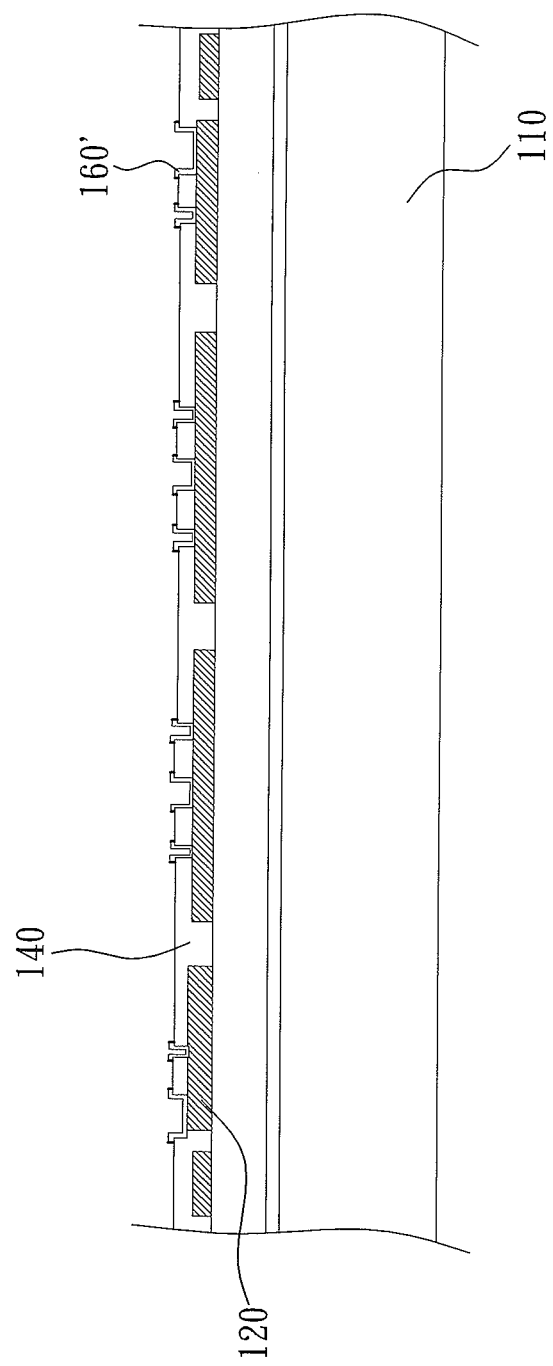
FIGS. 8A-8B illustrates a method for manufacturing the integrated MEMS device according to yet another embodiment of the present invention.
Figure 8B:
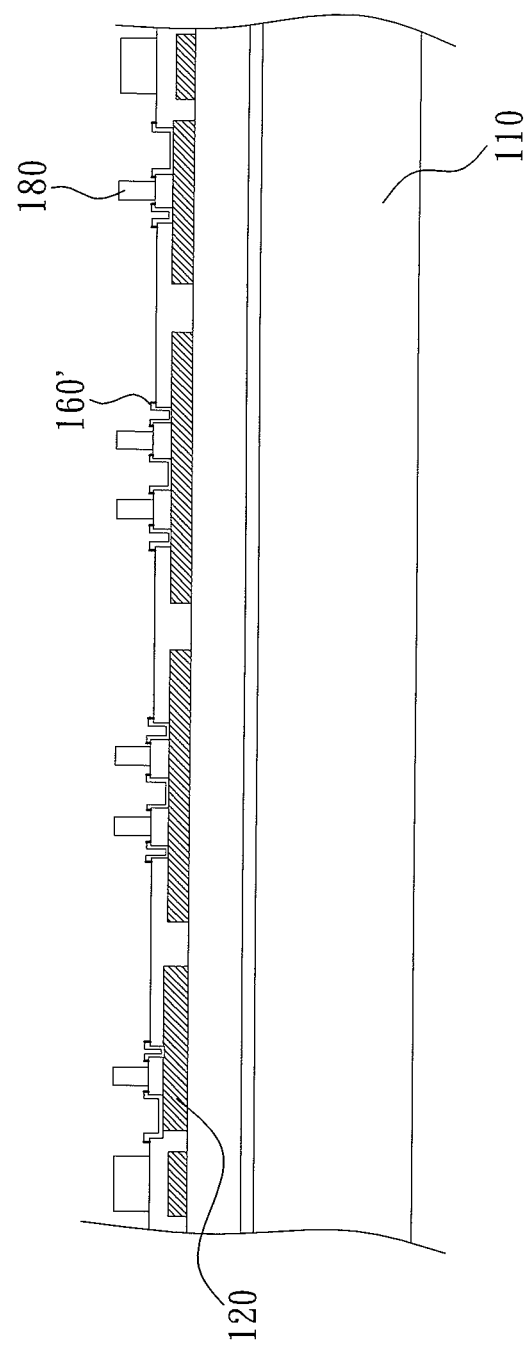

Next, a patterned second bonding layer 180 is formed on the second sacrificial layer 160 by lithography and etching processes according to FIG. 2D, wherein the second bonding layer 180 is composed of a bondable conductive material/materials. In this embodiment, since the second sacrificial layer 160 is formed to cover the whole device wafer 110, the second bonding layer 180 will overlap with a partial of the second sacrificial layer 160. In another embodiment, the overlap can be avoided, as shown in FIG. 8A-8B. A second sacrificial layer 160' is formed and patterned to partially cover the device wafer 110, as shown in FIG. 8A. In this embodiment, the second sacrificial layer 160' is formed to cover an exposed region of the first sacrificial layer 120 and not cover most portion of the first structural layer 140. As such, a patterned second bonding layer 180 can be formed without covering the second sacrificial layer 160' by lithography and etching processes according to FIG. 8B. This embodiment needs an extra photolithography layer to pattern the second sacrificial layer 160'.

Figure 2E:
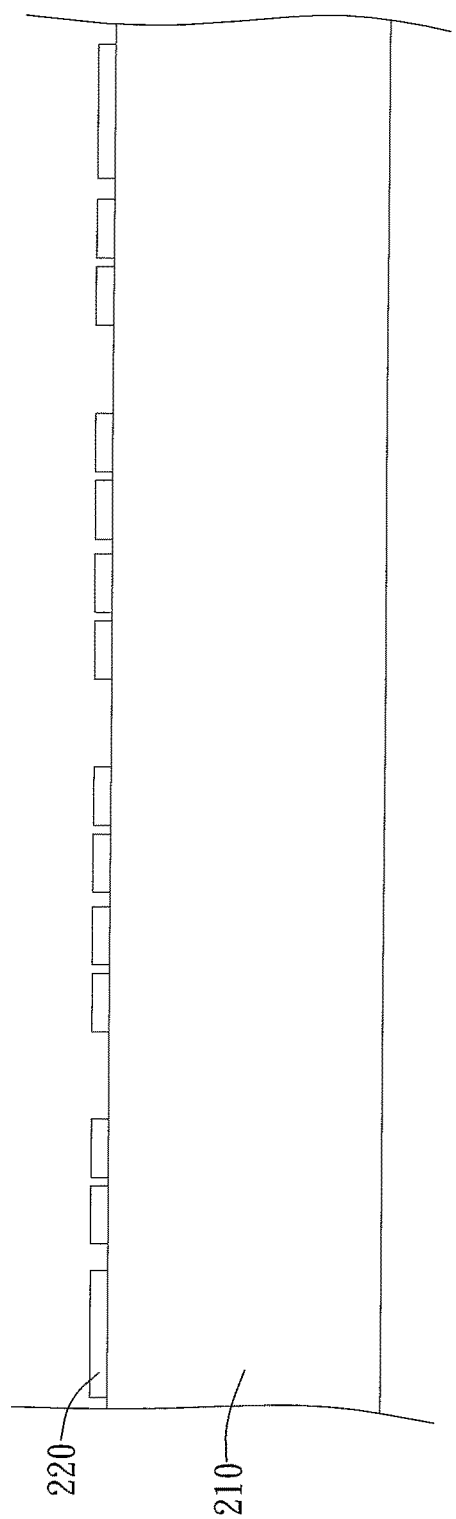

Next, a circuit wafer 210 is provided according to FIG. 2E, wherein one of the surfaces of the circuit wafer 210 comprises at least a patterned first bonding layer 220. The first bonding layer 220 may be composed of a metallic material used by CMOS processes and may further comprise other bondable conductive material/materials. Then, the first bonding layer 220 and the second bonding layer 180 are bonded together by a wafer bonding method such as an eutectic bonding process in order to bond the device wafer 110 and the circuit wafer 210 together. It is noted that when the device wafer 110 is bonded with the circuit wafer 210 in a face-to-face fashion, the first sacrificial layer 120 and the first structural layer 140 could form such a steady structure that it could withstand the temperature and pressure required to bond the device wafer 110 and the circuit wafer 210 together.

Figure 2F:
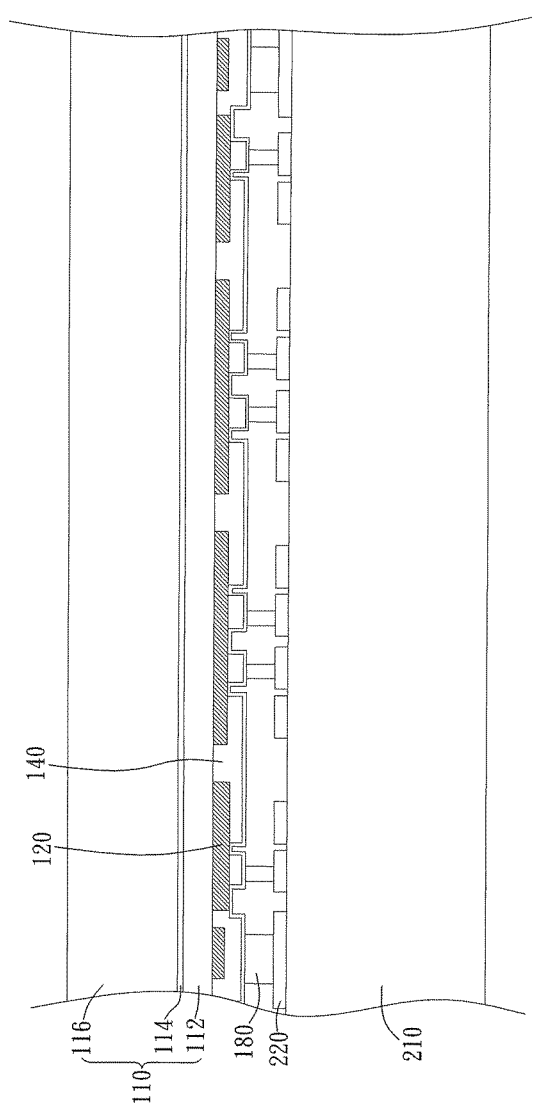
Figure 2G:
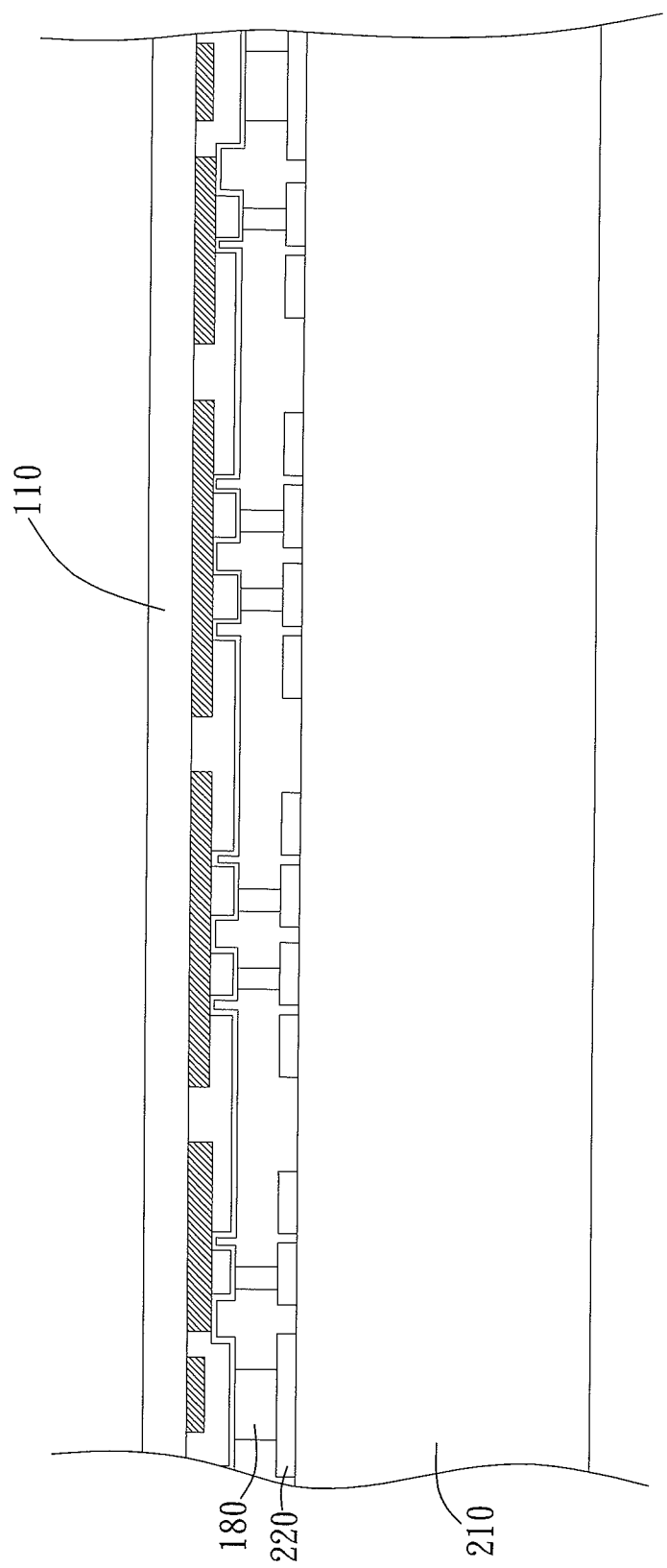

Next, a certain amount of thickness of the device wafer 110 is removed according to FIG. 2G. That is, the device wafer 110 is thinned down. The following paragraph would explain the thinning process of the device wafer 110 in detail.

First, please refer to FIGS. 2F and 2G. The silicon substrate 116 of the device wafer 110 is etched to remove the silicon substrate 116. Then, the insulating layer 114 of the device wafer 110 is removed while the silicon device layer 112 remains, wherein the silicon device layer 112 for example is composed of monocrystalline silicon. Since the insulating layer 114 and the silicon substrate use different materials, the insulating layer 114 could be used as an etching stop layer during the etching process. By doing so, the removed thickness of the device wafer 110 could be controlled accurately. Of course, a person of ordinary skills in the art could use other methods to reduce the thickness of the device wafer 110 such as mechanical lapping, grinding, chemical polishing and/or chemical mechanical polishing. Furthermore, the device wafer 110 is not limited to a structure of silicon on insulator (SOI).

Figure 2H:
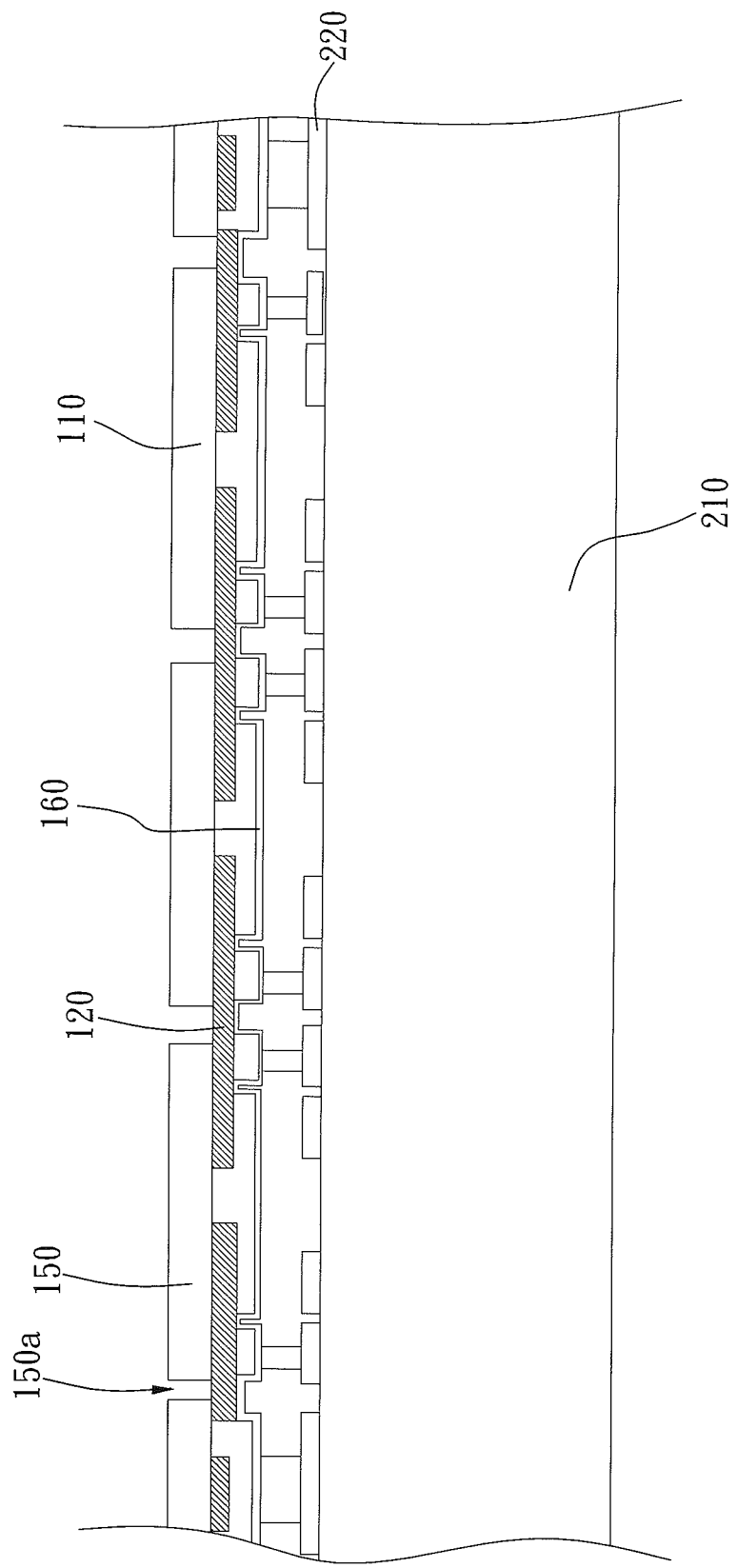

After thinning the device wafer 110, the device wafer 110 is patterned to form a patterned second structural layer 150 according to FIG. 2H. Since this second structural layer 150 is composed of monocrystalline silicon, it has less stress and smoother surface. As seen from FIG. 2H, there are a plurality of openings 150a formed in the second structural layer 150 and these openings expose a portion of the first sacrificial layer 120. Please note that the first sacrificial layer 120 can be acted as stop layer and protection layer to prevent defect generation such as PID (plasma induced damage) during forming the plurality of openings 150a.

Figure 2I:
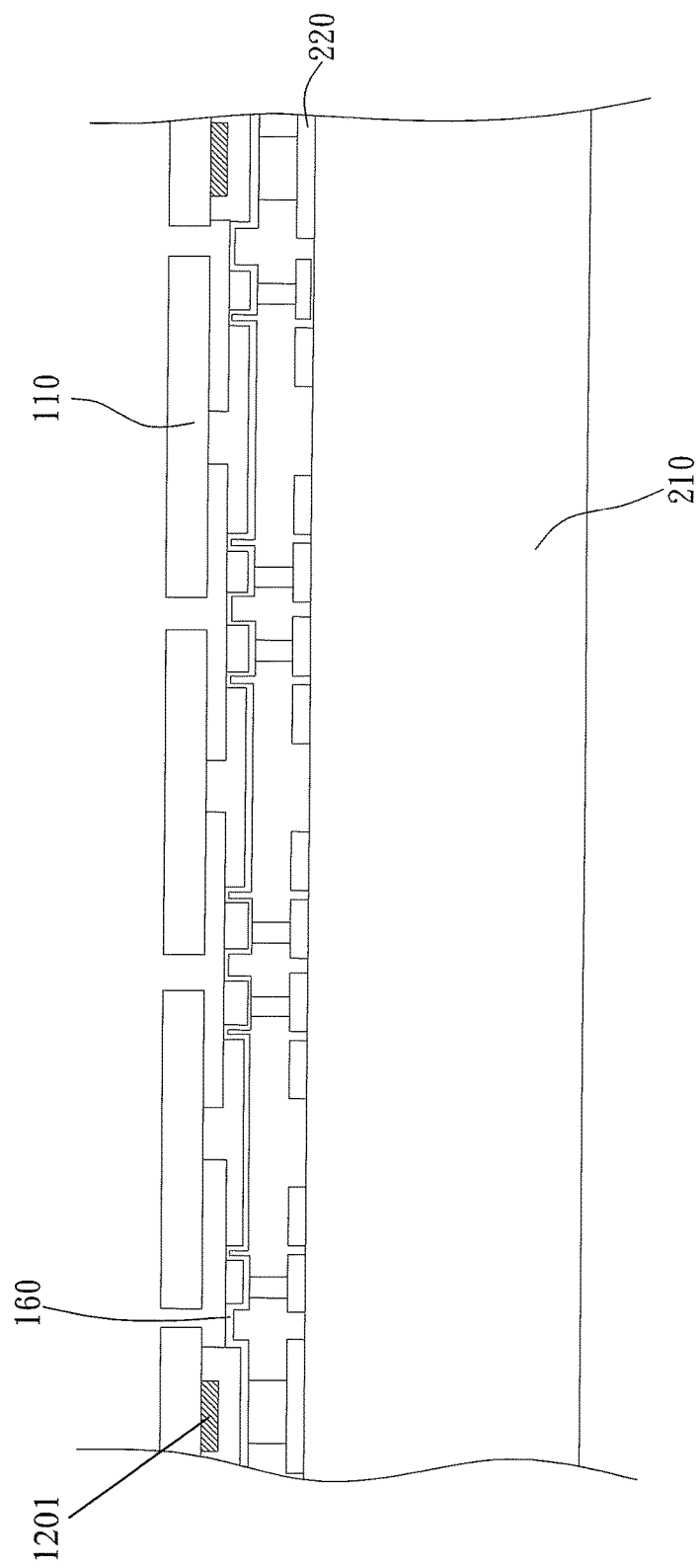

Next, the portion of the first sacrificial layer 120 exposed by those openings 150a is removed by for example etching and the rest portion 1201 of the first sacrificial layer 120 not exposed by those openings 150a remains according to FIG. 2I.

Moreover, since there is etching selectivity between the first sacrificial layer 120 and the second sacrificial layer 160, during wet etching of the first sacrificial layer 120, the sacrificial layer 160 could protect the devices on/within the circuit wafer 210 from being exposed to the etchants used to etch the first sacrificial layer 120, thereby preventing the devices on/within the circuit wafer 210 from damages. Then, the second sacrificial layer 160 is removed according to FIG. 2J. Still referring to FIG. 2J, it is found that, due to a portion of second sacrificial layer 1601 sandwiched between the second bonding layer 180 and the first structural layer 140, that portion of second sacrificial layer 1601 remains after completion of the integrated MEMS device wafer 100 while the rest exposed portion of the second sacrificial layer is completely removed. Because the second sacrificial layer 1601, the second bonding layer 180 and the first bonding layer 220 are all composed of conductive material/materials, they form a part of the electrical conductive path between the circuit wafer 210 and the device wafer 110 to transmit signals generated by the circuit wafer 210 to the first structural layer 140. Since the first structural layer 140 and the second structural layer 150 are physically coupled and movable jointly, it is possible to control the movement of the first structural layer 140 via electrode 2201 in the first bonding layer 220 in order to adjust the deformation of the second structural layer 150 hence the reflected direction of incident light shining thereon. The manufacturing of the integrated MEMS device wafer 100 is thus preliminarily completed.

It should be noted that in the foresaid embodiment the device wafer 110 and the circuit wafer 210 are bonded together by bonding the first bonding layer 220 and the second bonding layer 180. However, in an alternative embodiment the second bonding layer 180 could be omitted and the first bonding layer 220 is bonded to the second sacrificial layer 160. Or, in another alternative embodiment it is possible to bond the device wafer 110 and the circuit wafer 210 together by bonding the first bonding layer 220 directly to the first structural layer 140 without the second bonding layer 180 and the second sacrificial layer 160. The material of the first bonding layer 220 is such as gold, the material of the first structural layer 140 is such as polysilicon or amorphous silicon, and the bonding method is such as eutectic bonding.

It should also be noted that in the embodiment that a second sacrificial layer 160' is patterned, as shown in FIG. 8B, the second sacrificial layer 160' will be entirely removed due to no second bonding layer 180 covering the second sacrificial layer 160'.

Aside from using said second sacrificial layer 160 to protect the devices on/within the circuit wafer 210, it is also possible to cover the circuit wafer 210 with an additional passivation layer (not shown). This passivation layer is made for example from polymer/polymers and serves to cover regions outside a to-be-bonded region of the first bonding layer 220. In this present invention, the to-be-bonded region of the first bonding layer 220 refers to a region used to be bonded to the second bonding layer 180 or other devices during the manufacturing process. This passivation layer composed of polymer/polymers can protect the devices on/within the circuit wafer 210 from etchants used to etch the first sacrificial layer 120 while the first sacrificial layer 120 is wet etched. By doing so, there is no need to use the second sacrificial layer 160, thereby omitting process steps involving the second sacrificial layer 160 such as the step shown by FIG. 2C. However, it should be noted that most polymers can not withstand high temperature, so the process used to bond the device wafer 110 and the circuit wafer 210 is limited to a relatively-low-temperature process.

Figure 2J:
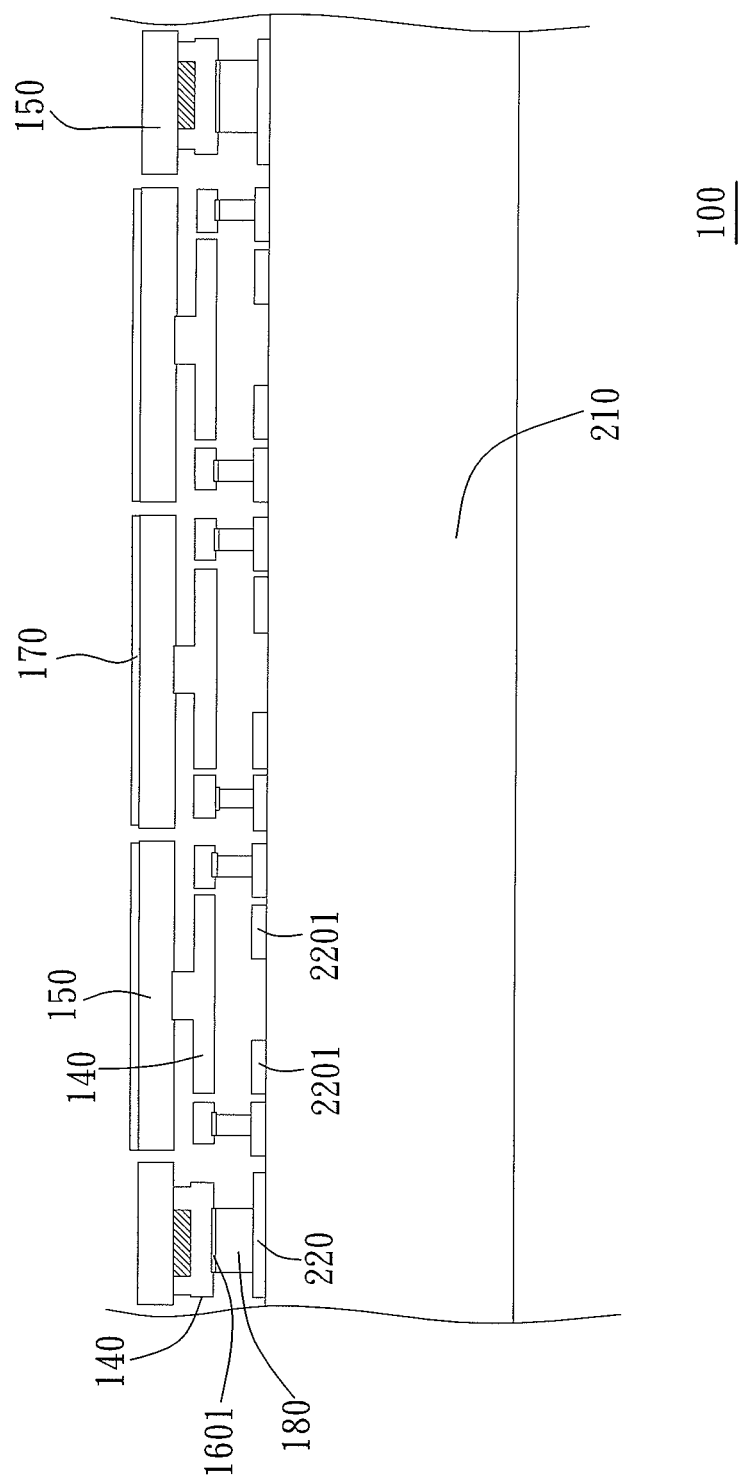

Still referring to FIG. 2J, a patterned metal layer 170 is optionally formed on the second structural layer 150 to reflect incident light. In this embodiment, the patterned metal layer 170 is formed after the formation of the second structural layer 150, but the patterned metal layer 170 may be formed before patterning the second structural layer 150. Afterward, the integrated MEMS wafer 100 could be cut into a plurality of integrated MEMS devices. After cutting the integrated MEMS wafer 100, what used to be a part of the device wafer 110 could be called a device chip while what used to be a part of the circuit wafer 210 could be called a circuit chip.

Figure 1:
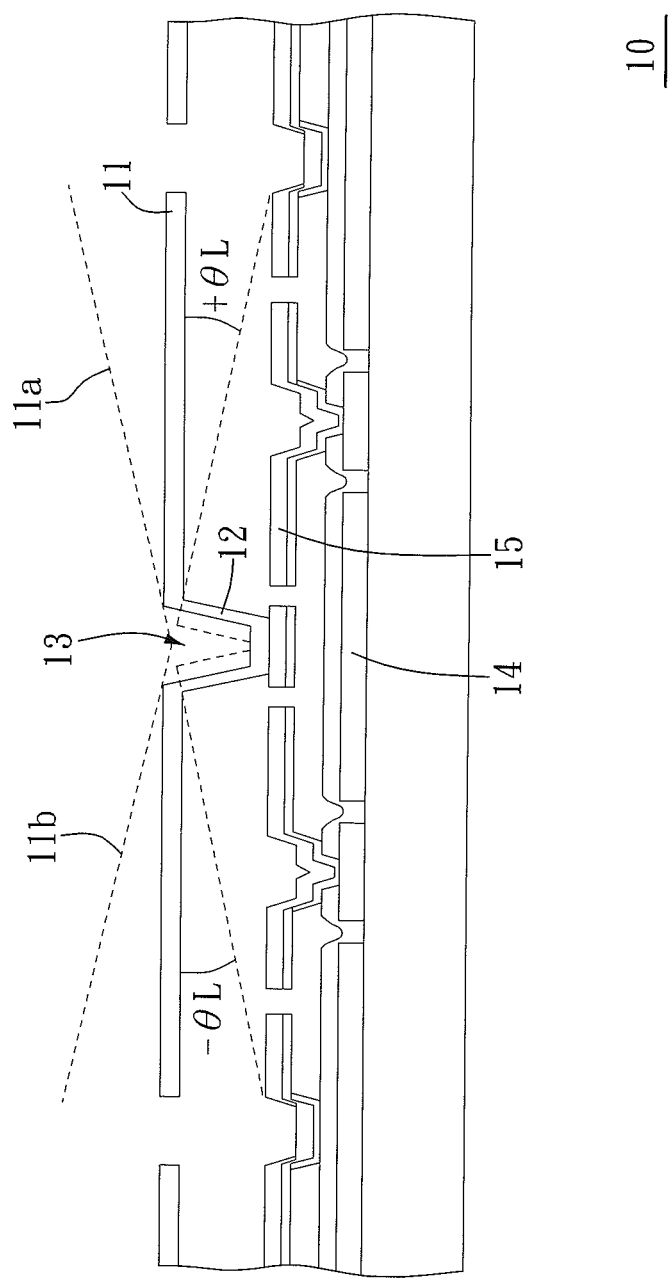
FIG. 1 illustrates the structure of the optical array-type device disclosed by U.S. Pat. No. 5,083,857.

Please compare the structures shown in FIG. 2J and in FIG. 1. The first structural layer 140 (corresponding to the flexible structural layer 15 in FIG. 1) is completely hidden under the second structural layer 150 (corresponding to the reflective mirror 11 in FIG. 1). Unlike reflective mirror 11 of FIG. 1, the second structural layer 150 does not have a recess 13 as the one shown in FIG. 1. Furthermore, monocrystalline silicon has better planar surface topography. Due to these reasons the structure shown in FIG. 2J could make more efficient use of light. From FIGS. 2A-2J, it is clear that, unlike prior art completes the circuit wafer and performs micro machining on the circuit wafer, the present invention could manufacture the device wafer 110 and the circuit wafer 210 separately. Therefore, unlike prior art limits the materials and temperatures used during device manufacturing, the present invention is not bound by such limits during manufacturing the device wafer 110. Moreover, it is more cost and process efficient to manufacture the device wafer 110 and the circuit wafer 210 separately.

Figure 3:
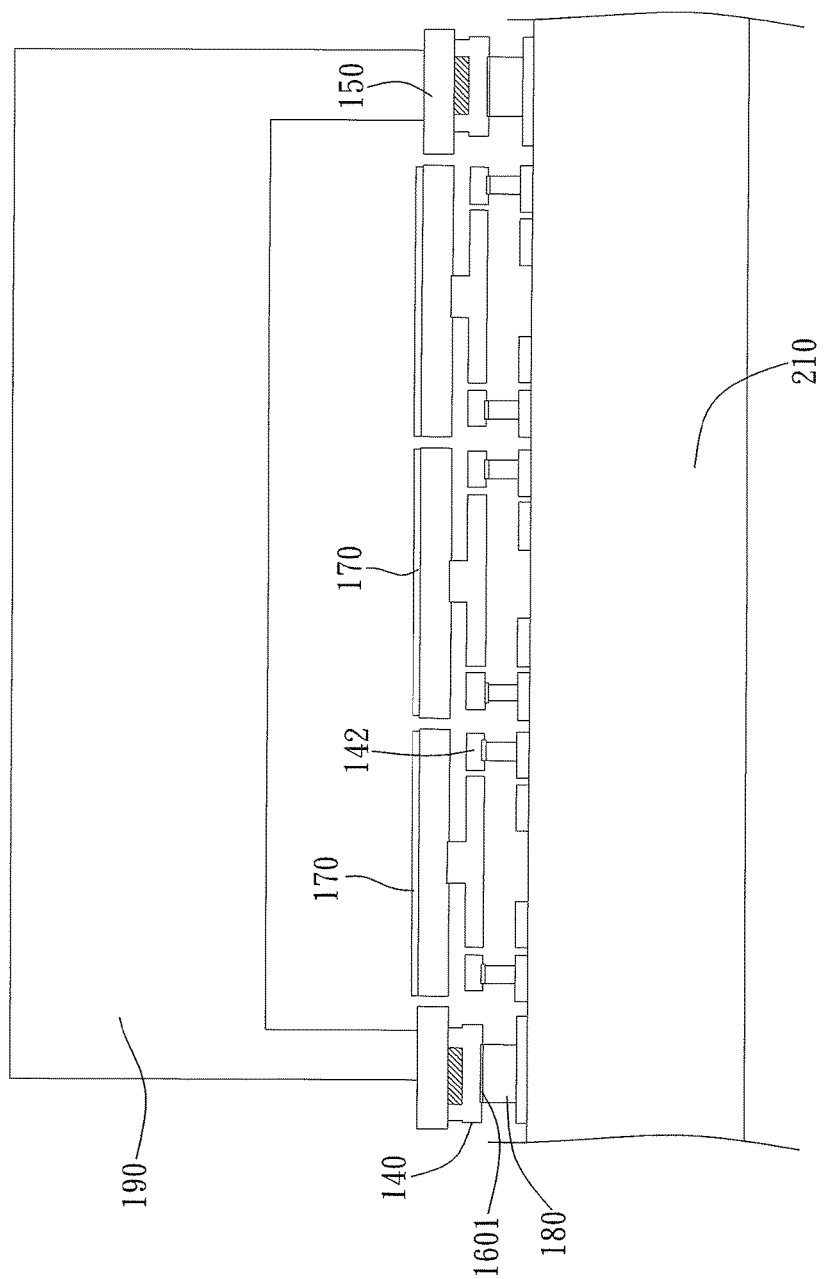
FIG. 3 illustrates the integrated MEMS device according to another embodiment.

Please refer to FIG. 3 which illustrates an integrated MEMS device according to another embodiment of the present invention. After forming and patterning the patterned metal layer 170 (as shown in FIG. 2J), a cover wafer 190 is disposed above the second structural layer 150, wherein the cover wafer 190 is fixed on the second structural layer 150 by polymer bonding or anodic bonding. In this embodiment, the cover wafer 190 is mainly made of glass and for protecting the internal wiring of the integrated MEMS wafer 100 from external contaminations. Thereafter, the integrated MEMS wafer 100 is cut into a plurality of integrated MEMS devices.

Figure 4:
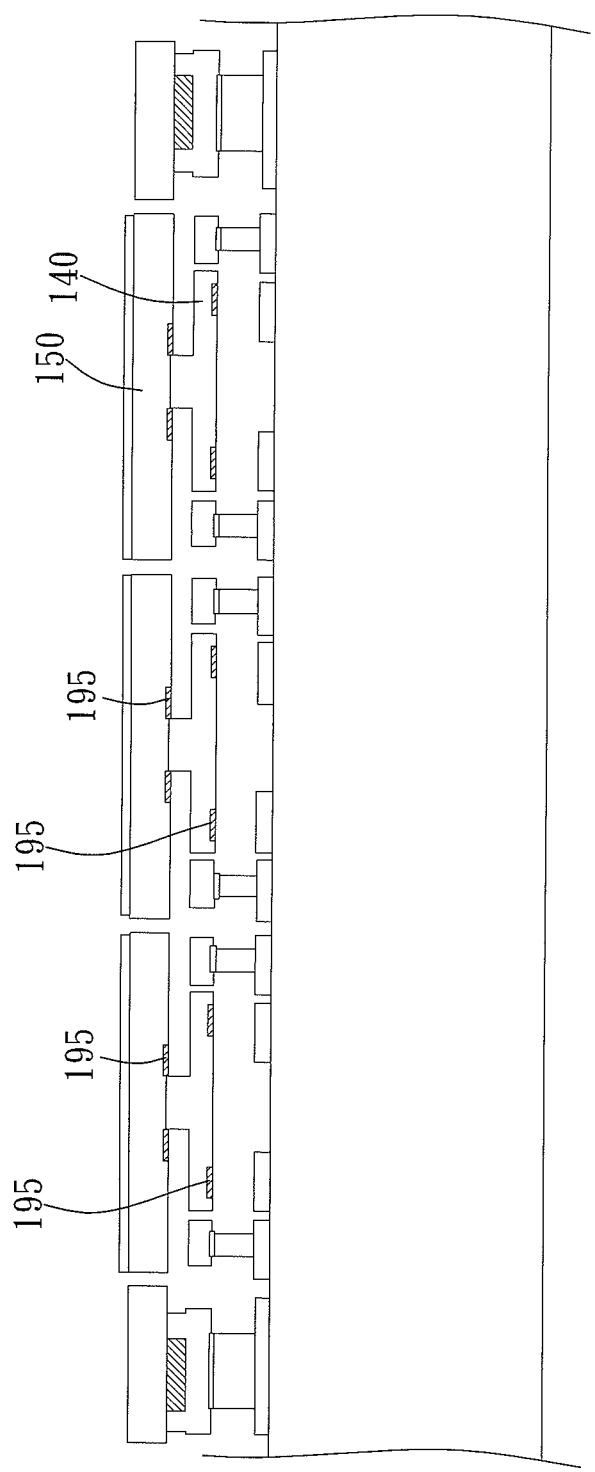
FIG. 4 illustrates the integrated MEMS device according to yet another embodiment.

Please refer to FIG. 4 which illustrates an integrated MEMS device according to still another embodiment of the present invention. Implantation processes of different dopant concentrations are performed in appropriate regions of the first structural layer 140 and/or the second structural layer 150 in order to form multiple localized piezoresistive regions 195 of low dopant concentrations and a connecting/bonding region of high dopant concentration (not shown). The implantation processes can be executed at between the processes as shown in FIG. 2A and FIG. 2B, and/or between the processes as shown in FIG. 2B and FIG. 2C in the foresaid embodiment. The piezoresistive regions 195 could be used to sense stress generated by the movements of the first structural layer 140 or the second structural layer 150 hence the moving status of the second structural layer 150. With this feature, actuators or sensors with feedback-loop and better precise performance could be achieved.

In the foresaid embodiments of integrated MEMS devices, array-type optical devices are used as examples. However, the manufacturing processes shown in FIGS. 2A-2J could be used to manufacture other types of MEMS devices. Please refer to FIGS. 5A to 5C which illustrates an integrated MEMS device according to yet another embodiment of the present invention. The integrated MEMS device 300 of this embodiment comprises a circuit chip 410 and a device chip 310. A first bonding layer 420 is formed on the surface of the circuit chip 410. The device chip 310 comprises a second bonding layer 380, a first structural layer 340 and a second structural layer 350. The patterned first bonding layer 420 is disposed on the circuit chip 410 and the second bonding layer 380 is connected to the first bonding layer 420. Furthermore, the first structural layer 340 is sandwiched between the second structural layer 350 and the second bonding layer 380. Furthermore, please refer to FIG. 5B. In the integrated MEMS device 300' shown in FIG. 5B, implantation processes of different dopant concentrations are performed in appropriate regions of the second structural layer 350 in order to form multiple localized piezoresistive regions 395 of low dopant concentrations and a connecting/bonding region of high dopant concentration (not shown). The piezoresistive regions 395 could be used to sense stress generated by the movements of the second structural layer 350 hence achieving actuators or sensors with feedback-loop and better precision. Moreover, the piezoresistive regions 395 could also be disposed in the first structural layer 340 (not shown).

Figure 5A:
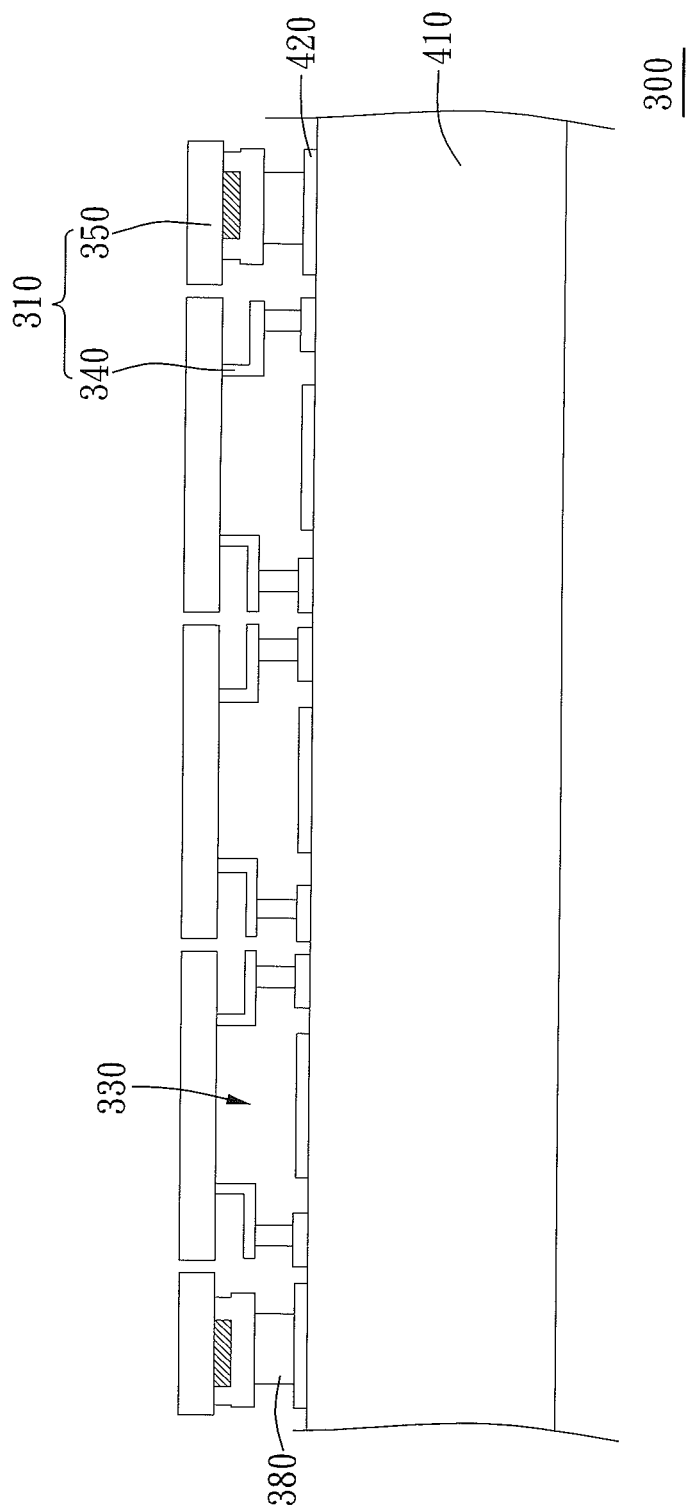
FIGS. 5A to 5C illustrates the integrated MEMS device according to yet another embodiment.
Figure 5B:
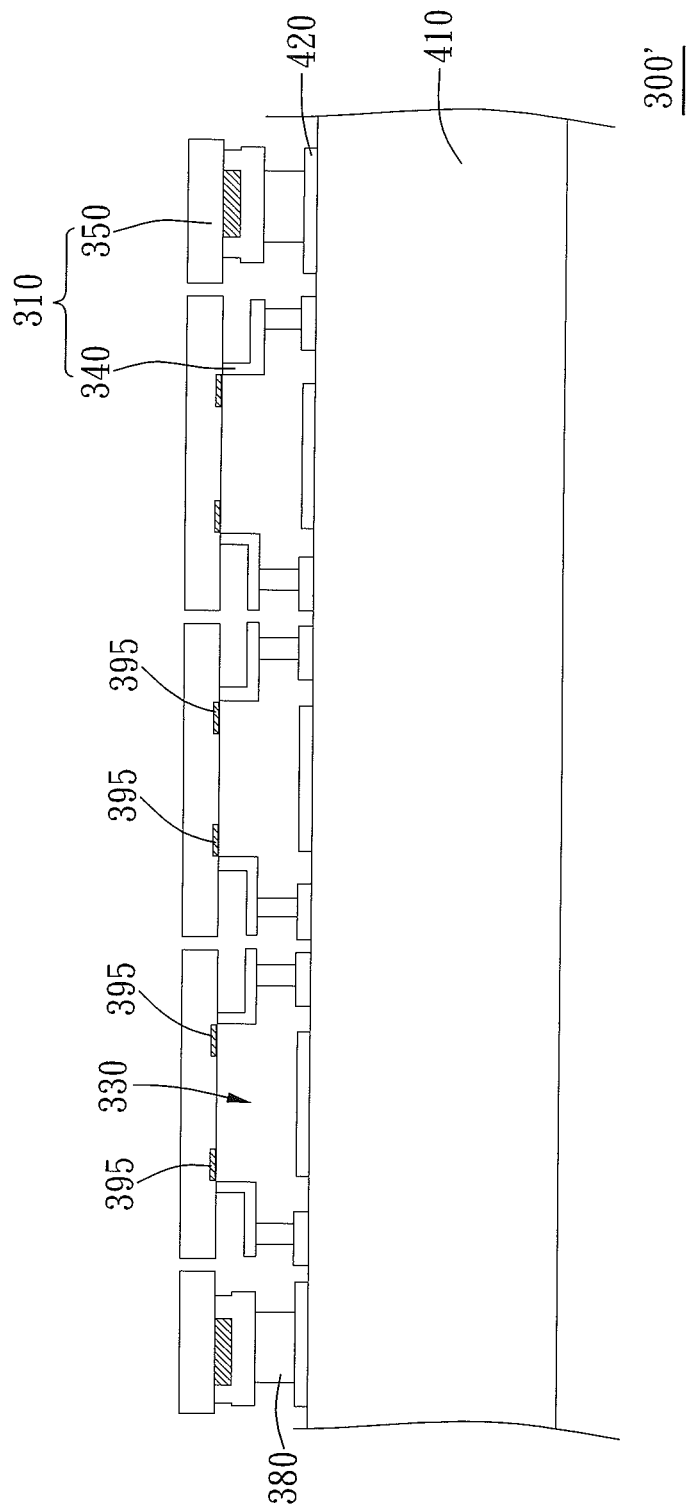
Figure 5C:
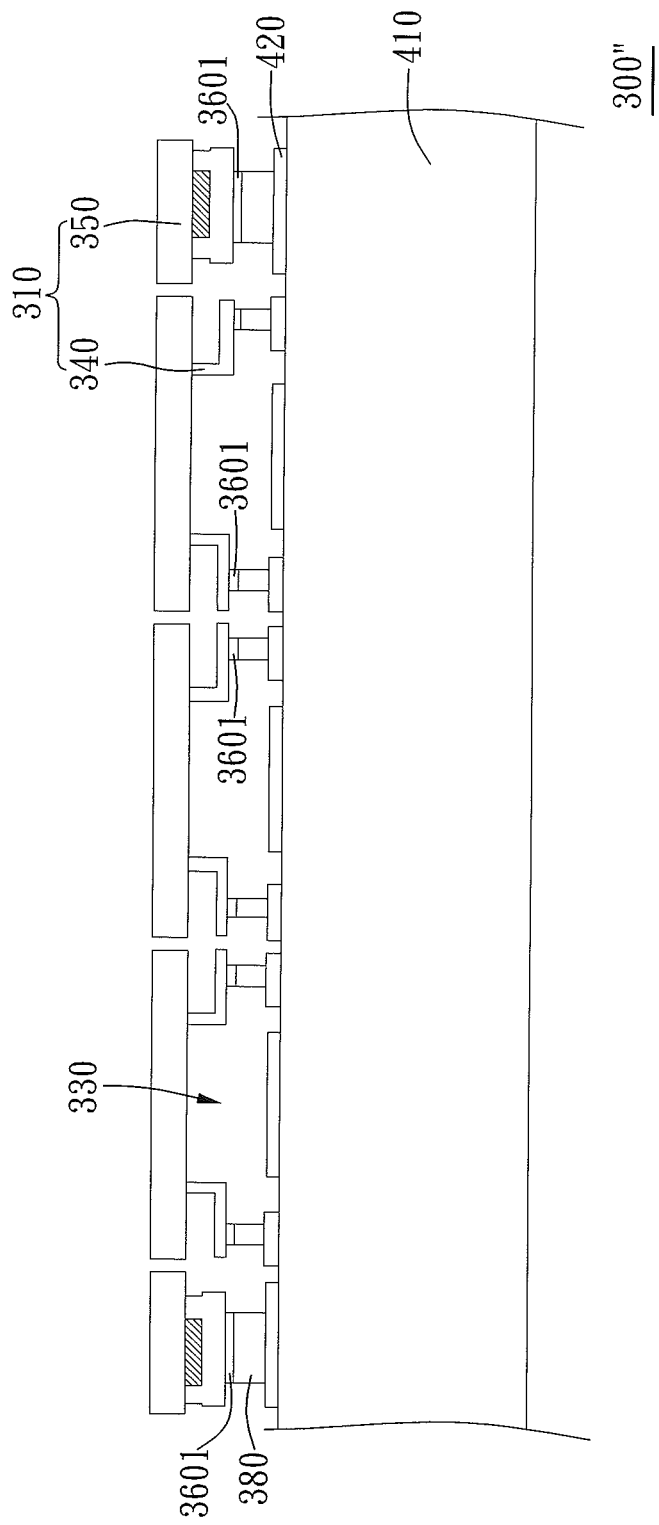

Furthermore, in the integrated MEMS device 300' shown in FIG. 5C, an additional second sacrificial layer 3601 could be disposed between the second bonding layer 380 and the first structural layer 340 depending on different purposes, wherein the second sacrificial layer 3601 is composed of a conductive material/materials. In the embodiment shown in FIG. 5C, the second sacrificial layer 3601 is similar to the second sacrificial layer 1601 because both of them are the remained sacrificial layers after completing the manufacturing process for the MEMS device.

In the foresaid embodiment, the device wafer 310 and the circuit wafer 410 are bonded together by bonding the first bonding layer 420 and the second bonding layer 380. However, it is possible to omit the second bonding layer 380 and have the first bonding layer 420 and the second sacrificial layer bonded directly. Or, the device wafer 310 and the circuit wafer 410 could be bonded together by bonding the first bonding layer 420 and the first structural layer 340 directly without disposing the second bonding layer 380 and the second sacrificial layer. In such embodiment some bump structures (not shown) made of the first structure layer 340 can be adopted and bonded to the first bonding layer in order to generate a spacing for deformation of the first structure layer 340.

Figure 6:
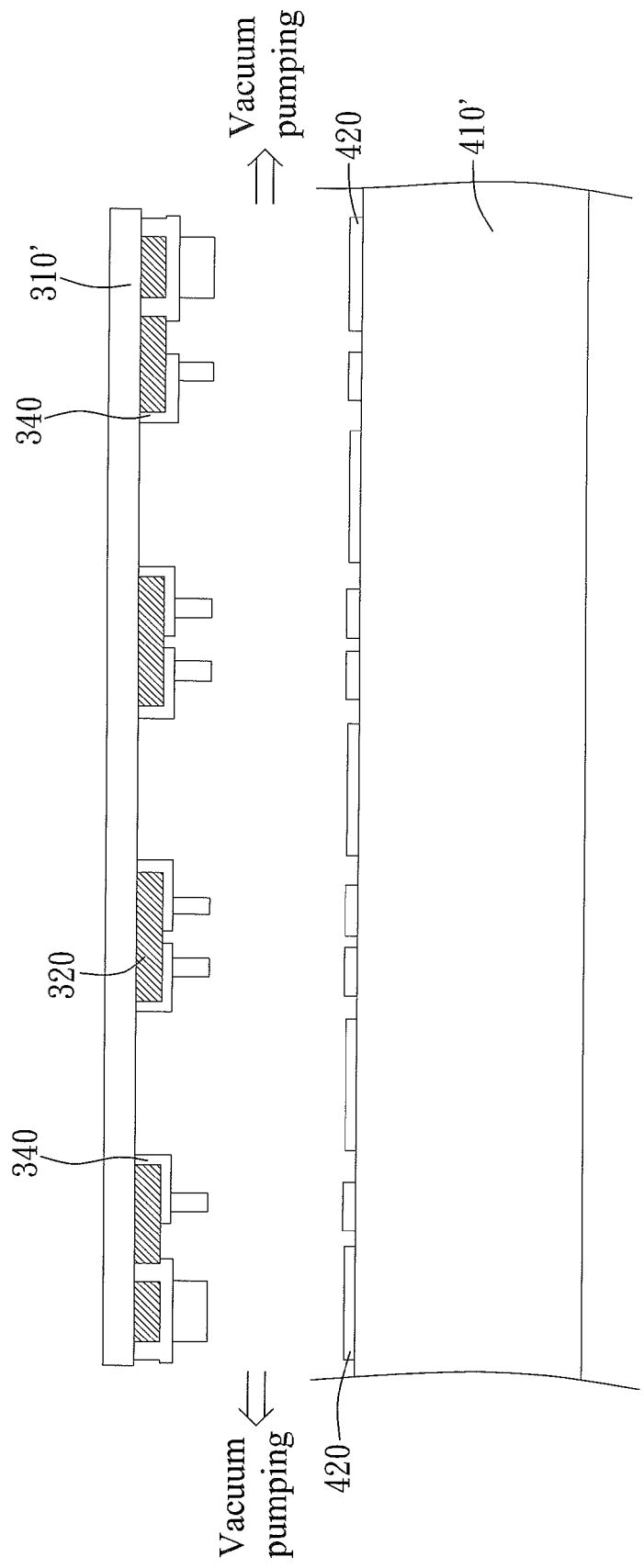
FIG. 6 is the schematic figure showing the integrated MEMS device upon evacuation.

It should be noted that there are many hermetic spaces 330 formed between the second structural layer 350 and the circuit chip 410, wherein the hermetic spaces 330 are enclosed by the first structural layer 340, the second structural layer 350, the second bonding layer 380 and the circuit chip 410. These hermetic spaces 330 in its vacuum state could facilitate the ability of the integrated MEMS device 300 to sense a change of the external air pressure sensibly and could reduce air resistance. Or, these hermetic spaces 330 could for example serve as acoustic transducers or ultrasonic transducers. To form the hermetic spaces 330 in its vacuum state, please refer to FIG. 6. Before bonding the device wafer 310' against the circuit wafer 410', an evacuation process is performed. By doing so, the hermetic spaces 330 in its vacuum state could be formed after the second bonding layer 380 of the device wafer 310' and the first bonding layer 420 of the circuit wafer 410' are bonded together. After bonding the device wafer 310' and the circuit wafer 410', the device wafer 310' is patterned and the first sacrificial layer 320 is removed. Afterward, a cutting process is performed to form the integrated MEMS device 300 shown in FIG. 5.

In FIG. 5A, the second structural layer 350 is made rigidly while the first structural layer 340 is made flexible so as to provide the device a required movement DOF (degree of freedom). In some applications, however, the second structural layer 350 can be made flexible and omit the first structural layer 340. To realize the structure, please refer to FIG. 7A-FIG. 7B.

Figure 7A:
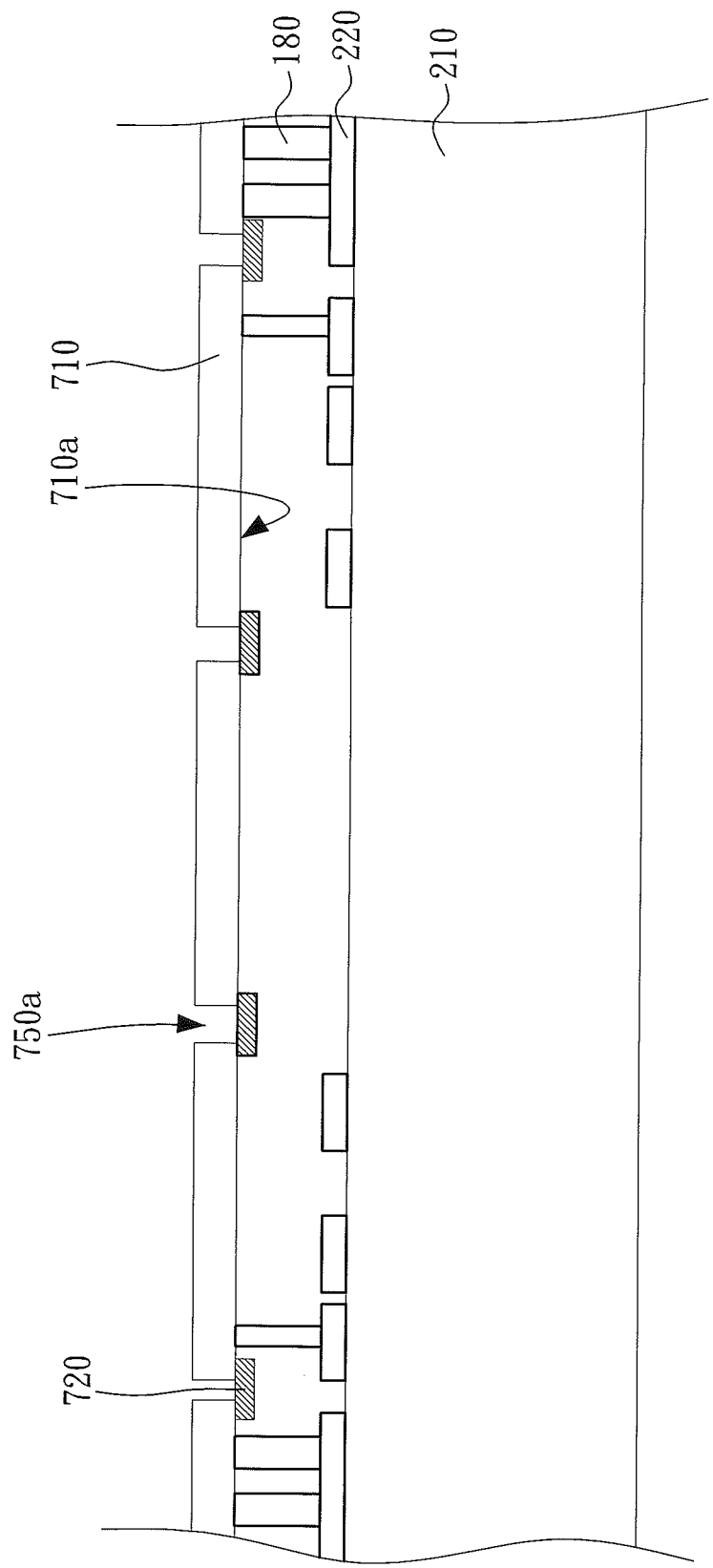
FIGS. 7A-7B illustrates a method for manufacturing the integrated MEMS device according to another embodiment of the present invention.
Figure 7B:
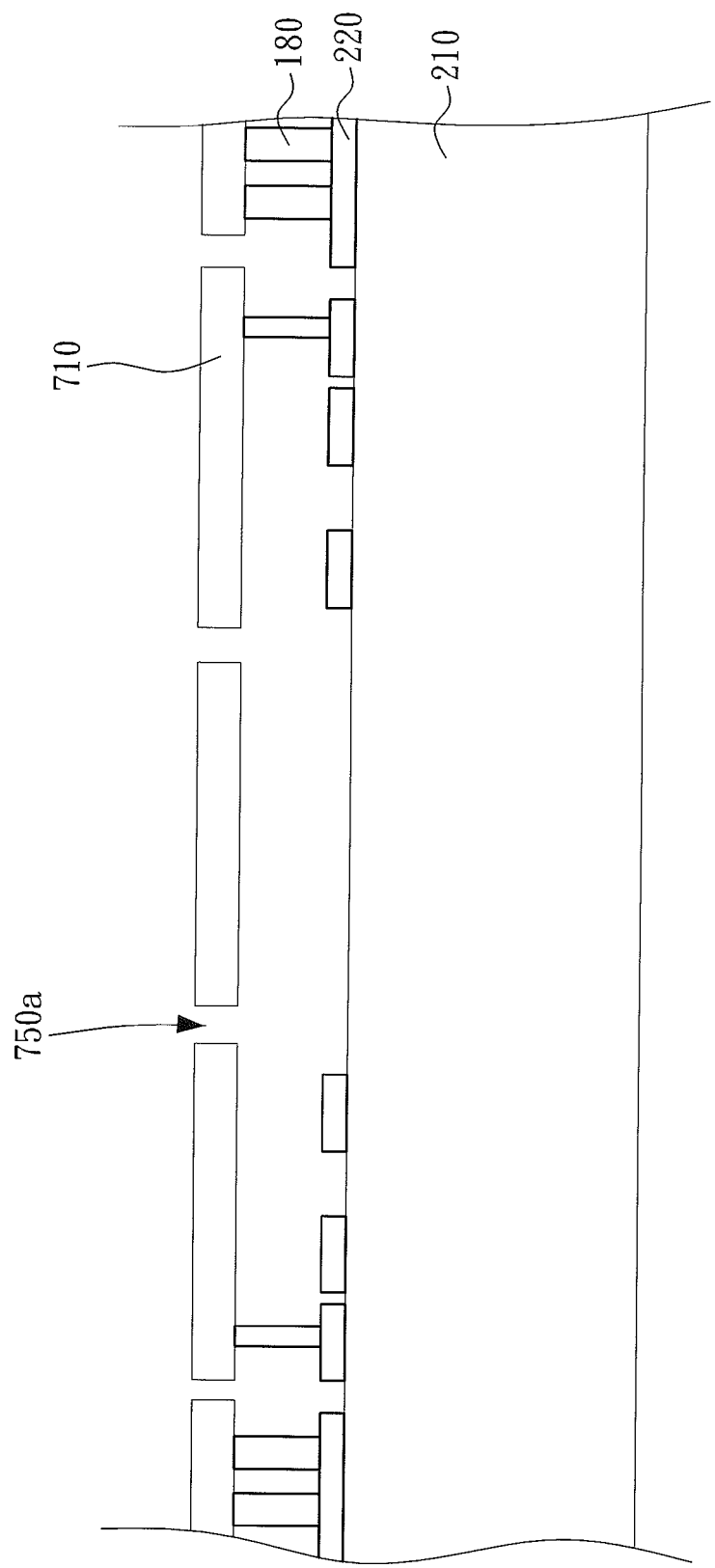

As shown in FIG. 7A, a first sacrificial layer 720 is formed and patterned on a first surface 710a on the device wafer 710. In this embodiment, the first sacrificial layer 720 is mainly composed of silicon oxide, metal such as copper or chromium, or silicon oxide/metal composite film. A patterned second bonding layer 180 composed of a bondable conductive material/materials can also be sequentially formed, to ease the wafer to wafer bonding process. A circuit wafer 210 comprising at least a patterned first bonding layer 220 is then bonded to the device wafer 710 together by a wafer bonding method such as an eutectic bonding process. The first bonding layer 220 may be composed of a metallic material used by CMOS processes and may further comprise other bondable conductive material/materials. Please be noted that the second bonding layer 180 can also be omitted. In such case, the first bonding layer 220 is directly boned to the structure layer 710. In such embodiment some bump structures (not shown) made of the structure layer 710 can be adopted and bonded to the first bonding layer in order to generate a spacing for deformation of structure layer 710. The device wafer 710 is then patterned to form a patterned second structural layer, after thinning the device wafer 710. Since this second structural layer 710 is composed of monocrystalline silicon, it has less stress and smoother surface. As seen from FIG. 7A, a plurality of openings 750a are formed and these openings 750a expose a portion of the first sacrificial layer 720. The first sacrificial layer 720 can be acted as stop layer and protection layer to prevent defect generation such as PID (plasma induced damage) during forming the plurality of openings 750a. The portion of the first sacrificial layer 720 exposed by those openings 750a is then removed by for example etching, as shown in FIG. 7B. In this embodiment, the second structural layer 710 is made flexible in in-plan or out-of-plan direction. The material of the first sacrificial layer 720 is chosen that it can prevent the devices on/within the circuit wafer 210 from damages during it being etched.

From all the embodiments described earlier, it is clear that by forming a sacrificial layer such as the first sacrificial layer then removing the sacrificial layer it is possible to make the structure shown in FIG. 5 with the first structural layer 340 hidden inside and this kind of structure could not be made by conventional process. With this kind of structure, a variety of MEMS devices could be manufactured. Although the integrated MEMS wafer 100 and the integrated MEMS device 300 are of array-type, the manufacturing processes shown in FIGS. 2A-2J is not limited for array-type and could be used for other types of MEMS structures.

Although the embodiments have been described in some detail for the purpose of promoting clarity of understanding, they are not intended to limit the claim scope the present invention. The scope of the present invention is defined by the appended claims and their equivalents. It is clear to a person of ordinary skill in the art that various omissions, substitutions, modifications and changes in the form of the embodiments described herein may be made without departing from the spirit of the present invention. The appended claims and their equivalents are intended to cover such forms or modifications as would fall within the scope and spirit of the present invention.

What is claimed is:

1. An integrated MEMS device, comprising:
   a circuit chip, having a patterned first bonding layer disposed thereon, the bonding layer being composed of a conductive material/materials; and
   a device chip, having a first structural layer and a second structural layer, the first structural layer being connected to the second structural layer and the first bonding layer of the circuit chip, and being sandwiched between the second structural layer and the circuit chip;
   wherein the first structure layer and the second structure layer have different patterns.

2. The device of claim 1, further comprising a second bonding layer between the first structural layer and the first bonding layer, the second bonding layer is composed of a bondable conductive material/materials, and the second bonding layer is bonded to the first bonding layer.

3. The device of claim 2, further comprising a second sacrificial layer between the second bonding layer and the device chip, the second sacrificial layer is composed of a conductive material/materials.

4. The device of claim 1, wherein the first structural layer is a flexible structure.

5. The device of claim 1, wherein the first structural layer is mainly composed of polysilicon, monocrystalline silicon, or amorphous silicon, and the second structural layer is mainly composed of monocrystalline silicon.

6. The device of claim 1, wherein a plurality of hermetic spaces are enclosed by the first structural layer, the second structural layer, the first bonding layer and the circuit chip.

7. The device of claim 6, wherein the hermetic spaces are in vacuum state.

8. The device of claim 1, wherein the second structural layer has planar surface topography with reflective metal layer deposited on top.

9. The device of claim 1, wherein a cover is disposed above the second structural layer to form a plurality of hermetic spaces enclosed by the cover, the first structural layer, the second structural layer, the first bonding layer, and the circuit chip.

10. An integrated MEMS device, comprising:
- a circuit chip, having a patterned first bonding layer disposed thereon, the bonding layer being composed of a conductive material/materials; and
- a device chip, having a first structural layer and a second structural layer, the first structural layer being connected to the second structural layer and the first bonding layer of the circuit chip, and being sandwiched between the second structural layer and the circuit chip;
- a second bonding layer, between the first structural layer and the first bonding layer, the second bonding layer is composed of a bondable conductive material/materials, and the second bonding layer is bonded to the first bonding layer,
- a second sacrificial layer, between the second bonding layer and the device chip, the second sacrificial layer is composed of a conductive material/materials.

11. The device of claim 10, wherein the first structural layer is a flexible structure.

12. The device of claim 10, wherein the first structural layer is mainly composed of polysilicon, monocrystalline silicon, or amorphous silicon, and the second structural layer is mainly composed of monocrystalline silicon.

13. The device of claim 10, wherein a plurality of hermetic spaces are enclosed by the first structural layer, the second structural layer, the first bonding layer and the circuit chip.

14. The device of claim 10, wherein a piezoresistive sensing unit is formed at least in one of the first structural layer and the second structural layer.

15. An integrated MEMS device, comprising:
- a circuit chip, having a patterned first bonding layer disposed thereon, the bonding layer being composed of a conductive material/materials; and
- a device chip, having a second structural layer being connected to the first bonding layer of the circuit chip;
- wherein the second structural layer has planar surface topography with reflective metal layer deposited on top.

16. The device of claim 15, further comprising a second bonding layer between the second structural layer and the first bonding layer, the second bonding layer is composed of a bondable conductive material/materials, and the second bonding layer is bonded to the first bonding layer.

17. The device of claim 16, further comprising a second sacrificial layer between the second bonding layer and the device chip, the second sacrificial layer is composed of a conductive material/materials.

18. The device of claim 15, wherein the second structural layer is mainly composed of monocrystalline silicon.

19. The device of claim 15, wherein a plurality of hermetic spaces are enclosed by the second structural layer, the first bonding layer and the circuit chip.

20. The device of claim 15, wherein a piezoresistive sensing unit is formed in the second structural layer.

* * * * *